United States Patent
Vijaykumar et al.

(10) Patent No.: US 12,328,083 B2
(45) Date of Patent: Jun. 10, 2025

(54) SYSTEMS AND METHODS FOR GALVANIC ISOLATION FOR INVERTER FOR ELECTRIC VEHICLE

(71) Applicant: BorgWarner US Technologies LLC, Wilmington, DE (US)

(72) Inventors: Srikanth Vijaykumar, Carmel, IN (US); Seyed R. Zarabadi, Kokomo, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 349 days.

(21) Appl. No.: 18/150,927

(22) Filed: Jan. 6, 2023

(65) Prior Publication Data
US 2024/0103045 A1    Mar. 28, 2024

Related U.S. Application Data

(60) Provisional application No. 63/377,486, filed on Sep. 28, 2022, provisional application No. 63/377,501, (Continued)

(51) Int. Cl.
*H02P 27/06* (2006.01)
*B60L 3/00* (2019.01)
(Continued)

(52) U.S. Cl.
CPC .............. *H02P 27/06* (2013.01); *B60L 3/003* (2013.01); *B60L 15/007* (2013.01); *B60L 15/08* (2013.01);
(Continued)

(58) Field of Classification Search
CPC .......... H02P 27/06; B60L 53/20; B60L 53/22; G01R 15/20
See application file for complete search history.

(56) References Cited

U.S. PATENT DOCUMENTS

| | | |
|---|---|---|
| 4,054,828 A | 10/1977 | Conzelmann et al. |
| 4,128,801 A | 12/1978 | Gansert et al. |

(Continued)

FOREIGN PATENT DOCUMENTS

| | | |
|---|---|---|
| WO | 2007093598 A1 | 8/2007 |
| WO | 2019034505 A1 | 2/2019 |

(Continued)

OTHER PUBLICATIONS

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

(Continued)

*Primary Examiner* — Rina I Duda
(74) *Attorney, Agent, or Firm* — Joshua M. Haines; Bookoff McAndrews, PLLC

(57) ABSTRACT

A system includes an inverter including: a first galvanic isolator separating a low voltage area from a high voltage area, the first galvanic isolator having a first galvanic isolator output path; a second galvanic isolator having a second galvanic isolator output path; an amplifier connected to the first galvanic isolator via the first galvanic isolator output path, and connected to the second galvanic isolator via the second galvanic isolator output path, the amplifier having a first amplifier output path and a second amplifier output path; a comparator connected to the amplifier via the first amplifier output path and the second amplifier output path, the comparator having a first comparator output path and a second comparator output path; and a pulse reshape and envelope detector connected to the comparator via the first comparator output path and the second comparator output path.

20 Claims, 12 Drawing Sheets

Related U.S. Application Data filed on Sep. 28, 2022, provisional application No. 63/377,512, filed on Sep. 28, 2022, provisional application No. 63/378,601, filed on Oct. 6, 2022.

(51) Int. Cl.
| | |
|---|---|
| *B60L 15/00* | (2006.01) |
| *B60L 15/08* | (2006.01) |
| *B60L 50/40* | (2019.01) |
| *B60L 50/51* | (2019.01) |
| *B60L 50/60* | (2019.01) |
| *B60L 50/64* | (2019.01) |
| *B60L 53/20* | (2019.01) |
| *B60L 53/22* | (2019.01) |
| *B60L 53/62* | (2019.01) |
| *B60R 16/02* | (2006.01) |
| *G01R 15/20* | (2006.01) |
| *G06F 1/08* | (2006.01) |
| *G06F 13/40* | (2006.01) |
| *H01L 21/48* | (2006.01) |
| *H01L 23/00* | (2006.01) |
| *H01L 23/15* | (2006.01) |
| *H01L 23/367* | (2006.01) |
| *H01L 23/373* | (2006.01) |
| *H01L 23/40* | (2006.01) |
| *H01L 23/467* | (2006.01) |
| *H01L 23/473* | (2006.01) |
| *H01L 23/495* | (2006.01) |
| *H01L 23/538* | (2006.01) |
| *H01L 25/00* | (2006.01) |
| *H01L 25/07* | (2006.01) |
| *H02J 7/00* | (2006.01) |
| *H02M 1/00* | (2006.01) |
| *H02M 1/08* | (2006.01) |
| *H02M 1/084* | (2006.01) |
| *H02M 1/088* | (2006.01) |
| *H02M 1/12* | (2006.01) |
| *H02M 1/32* | (2007.01) |
| *H02M 1/42* | (2007.01) |
| *H02M 1/44* | (2007.01) |
| *H02M 3/335* | (2006.01) |
| *H02M 7/00* | (2006.01) |
| *H02M 7/537* | (2006.01) |
| *H02M 7/5387* | (2007.01) |
| *H02M 7/5395* | (2006.01) |
| *H02P 27/08* | (2006.01) |
| *H02P 29/024* | (2016.01) |
| *H02P 29/68* | (2016.01) |
| *H05K 1/14* | (2006.01) |
| *H05K 1/18* | (2006.01) |
| *H05K 5/02* | (2006.01) |
| *H05K 7/20* | (2006.01) |
| *H10D 64/01* | (2025.01) |
| *B60L 15/20* | (2006.01) |
| *H03K 19/20* | (2006.01) |

(52) U.S. Cl.
CPC .............. *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *H05K 7/20927* (2013.01); *H10D 64/018* (2025.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(56) References Cited

U.S. PATENT DOCUMENTS

| | | |
|---|---|---|
| 4,564,771 A | 1/1986 | Flohrs |
| 4,618,875 A | 10/1986 | Flohrs |
| 4,716,304 A | 12/1987 | Fiebig et al. |
| 5,068,703 A | 11/1991 | Conzelmann et al. |
| 5,432,371 A | 7/1995 | Denner et al. |
| 5,559,661 A | 9/1996 | Meinders |
| 5,654,863 A | 8/1997 | Davies |
| 5,764,007 A | 6/1998 | Jones |
| 5,841,312 A | 11/1998 | Mindl et al. |
| 6,028,470 A | 2/2000 | Michel et al. |
| 6,163,138 A | 12/2000 | Kohl et al. |
| 6,351,173 B1 | 2/2002 | Ovens et al. |
| 6,426,857 B1 | 7/2002 | Doster et al. |
| 6,597,556 B1 | 7/2003 | Michel et al. |
| 6,812,553 B2 | 11/2004 | Gerbsch et al. |
| 6,943,293 B1 | 9/2005 | Jeter et al. |
| 7,095,098 B2 | 8/2006 | Gerbsch et al. |
| 7,229,855 B2 | 6/2007 | Murphy |
| 7,295,433 B2 | 11/2007 | Taylor et al. |
| 7,459,954 B2 | 12/2008 | Kuehner et al. |
| 7,538,425 B2 | 5/2009 | Myers et al. |
| 7,551,439 B2 | 6/2009 | Peugh et al. |
| 7,616,047 B2 | 11/2009 | Rees et al. |
| 7,724,046 B2 | 5/2010 | Wendt et al. |
| 7,741,896 B2 | 6/2010 | Chow et al. |
| 7,750,720 B2 | 7/2010 | Dittrich |
| 7,834,575 B2 * | 11/2010 | Hauenstein ............ H01L 25/16 |
| | | 257/500 |

(56) References Cited

U.S. PATENT DOCUMENTS

| | | | |
|---|---|---|---|
| 7,956,566 B2 * | 6/2011 | Hauenstein | H01Q 1/2283 |
| | | | 318/569 |
| 8,502,584 B1 | 8/2013 | Dong et al. | |
| 9,088,159 B2 | 7/2015 | Peuser | |
| 9,275,915 B2 | 3/2016 | Heinisch et al. | |
| 9,373,970 B2 | 6/2016 | Feuerstack et al. | |
| 9,431,932 B2 | 8/2016 | Schmidt et al. | |
| 9,515,584 B2 | 12/2016 | Koller et al. | |
| 9,548,675 B2 | 1/2017 | Schoenknecht | |
| 9,621,383 B1 | 4/2017 | Urienza | |
| 9,806,607 B2 | 10/2017 | Ranmuthu et al. | |
| 9,843,320 B2 | 12/2017 | Richter et al. | |
| 9,866,126 B2 | 1/2018 | Sato | |
| 9,871,444 B2 | 1/2018 | Ni et al. | |
| 9,882,490 B2 | 1/2018 | Veeramreddi et al. | |
| 10,111,285 B2 | 10/2018 | Shi et al. | |
| 10,116,300 B2 | 10/2018 | Blasco et al. | |
| 10,232,718 B2 | 3/2019 | Trunk et al. | |
| 10,270,354 B1 | 4/2019 | Lu et al. | |
| 10,291,225 B2 | 5/2019 | Li et al. | |
| 10,525,847 B2 | 1/2020 | Strobel et al. | |
| 10,601,614 B1 * | 3/2020 | Liu | H04L 27/2275 |
| 10,763,844 B2 * | 9/2020 | Bang | H03K 17/08122 |
| 10,797,579 B2 | 10/2020 | Hashim et al. | |
| 10,924,001 B2 | 2/2021 | Li et al. | |
| 11,082,052 B2 | 8/2021 | Jang et al. | |
| 11,108,389 B2 | 8/2021 | Li et al. | |
| 11,342,911 B2 | 5/2022 | Lee et al. | |
| 11,838,011 B2 | 12/2023 | Li et al. | |
| 11,843,320 B2 | 12/2023 | Sivakumar et al. | |
| 11,848,426 B2 | 12/2023 | Zhang et al. | |
| 11,851,038 B2 | 12/2023 | Solanki et al. | |
| 11,855,522 B2 | 12/2023 | Rudolph et al. | |
| 11,855,630 B2 | 12/2023 | Dake et al. | |
| 11,870,338 B1 | 1/2024 | Narayanasamy | |
| 11,872,997 B2 | 1/2024 | Hoos et al. | |
| 11,881,859 B2 | 1/2024 | Gupta et al. | |
| 11,888,391 B2 | 1/2024 | Balasubramanian et al. | |
| 11,888,393 B2 | 1/2024 | Venkateswaran et al. | |
| 11,901,803 B2 | 2/2024 | Ruck et al. | |
| 11,901,881 B1 | 2/2024 | Narayanasamy | |
| 11,909,319 B2 | 2/2024 | Esteghlal et al. | |
| 11,916,426 B2 | 2/2024 | Oner et al. | |
| 11,923,762 B2 | 3/2024 | Sethumadhavan et al. | |
| 11,923,764 B1 | 3/2024 | Zhang | |
| 11,923,799 B2 | 3/2024 | Ojha et al. | |
| 11,925,119 B2 | 3/2024 | Male et al. | |
| 11,927,624 B2 | 3/2024 | Patel et al. | |
| 11,938,838 B2 | 3/2024 | Simonis et al. | |
| 11,942,927 B2 | 3/2024 | Purcarea et al. | |
| 11,942,934 B2 | 3/2024 | Ritter | |
| 11,945,331 B2 | 4/2024 | Blemberg et al. | |
| 11,945,522 B2 | 4/2024 | Matsumura et al. | |
| 11,949,320 B2 | 4/2024 | Jaladanki et al. | |
| 11,949,333 B2 | 4/2024 | Pahkala et al. | |
| 11,955,896 B2 | 4/2024 | Liu et al. | |
| 11,955,953 B2 | 4/2024 | Sinn et al. | |
| 11,955,964 B2 | 4/2024 | Agarwal et al. | |
| 11,962,234 B2 | 4/2024 | Narayanasamy et al. | |
| 11,962,291 B2 | 4/2024 | Oberdieck et al. | |
| 11,964,587 B2 | 4/2024 | Yukawa | |
| 11,970,076 B2 | 4/2024 | Sarfert et al. | |
| 11,977,404 B2 | 5/2024 | Chandrasekaran | |
| 11,984,802 B2 | 5/2024 | Merkin et al. | |
| 11,984,876 B2 | 5/2024 | Neidorff et al. | |
| 11,990,776 B2 | 5/2024 | Dulle | |
| 11,990,777 B2 | 5/2024 | Woll et al. | |
| 11,996,686 B2 | 5/2024 | Chan et al. | |
| 11,996,699 B2 | 5/2024 | Vasconcelos Araujo et al. | |
| 11,996,714 B2 | 5/2024 | El Markhi et al. | |
| 11,996,715 B2 | 5/2024 | Nandi et al. | |
| 11,996,762 B2 | 5/2024 | Hembach et al. | |
| 11,996,830 B2 | 5/2024 | Murthy et al. | |
| 11,996,847 B1 | 5/2024 | Kazama et al. | |
| 12,003,191 B2 | 6/2024 | Chaudhary et al. | |
| 12,003,229 B2 | 6/2024 | Kaya et al. | |
| 12,003,237 B2 | 6/2024 | Waters | |
| 12,008,847 B2 | 6/2024 | Braun et al. | |
| 12,009,679 B2 | 6/2024 | Gottwald et al. | |
| 12,012,057 B2 | 6/2024 | Schneider et al. | |
| 12,015,342 B2 | 6/2024 | Kienzler et al. | |
| 12,019,112 B2 | 6/2024 | Jarmolowitz et al. | |
| 12,021,517 B2 | 6/2024 | Sachin et al. | |
| 2017/0331469 A1 | 11/2017 | Kilb et al. | |
| 2020/0076425 A1 * | 3/2020 | Garg | H03K 17/6871 |
| 2020/0195121 A1 | 6/2020 | Keskar et al. | |
| 2021/0005711 A1 | 1/2021 | Martinez-Limia et al. | |
| 2022/0052610 A1 | 2/2022 | Plum | |
| 2022/0294441 A1 | 9/2022 | Purcarea et al. | |
| 2023/0010616 A1 | 1/2023 | Gschwantner et al. | |
| 2023/0061922 A1 | 3/2023 | Ritter | |
| 2023/0082076 A1 | 3/2023 | Strache et al. | |
| 2023/0126070 A1 | 4/2023 | Oberdieck et al. | |
| 2023/0179198 A1 | 6/2023 | Winkler | |
| 2023/0231210 A1 | 7/2023 | Joos et al. | |
| 2023/0231400 A1 | 7/2023 | Oberdieck et al. | |
| 2023/0231496 A1 | 7/2023 | Syed et al. | |
| 2023/0238808 A1 | 7/2023 | Swoboda et al. | |
| 2023/0268826 A1 | 8/2023 | Yan et al. | |
| 2023/0335509 A1 | 10/2023 | Poddar | |
| 2023/0365086 A1 | 11/2023 | Schumacher et al. | |
| 2023/0370062 A1 | 11/2023 | Wolf | |
| 2023/0378022 A1 | 11/2023 | Kim et al. | |
| 2023/0386963 A1 | 11/2023 | Kim et al. | |
| 2023/0402930 A1 | 12/2023 | Corry et al. | |
| 2023/0420968 A1 | 12/2023 | Oner et al. | |
| 2023/0421049 A1 | 12/2023 | Neidorff | |
| 2024/0006869 A1 | 1/2024 | Kim et al. | |
| 2024/0006899 A1 | 1/2024 | Wernerus | |
| 2024/0006993 A1 | 1/2024 | Barjati et al. | |
| 2024/0022187 A1 | 1/2024 | Fassnacht | |
| 2024/0022240 A1 | 1/2024 | Balaz | |
| 2024/0022244 A1 | 1/2024 | Sachin et al. | |
| 2024/0030730 A1 | 1/2024 | Wernerus | |
| 2024/0039062 A1 | 2/2024 | Wernerus | |
| 2024/0039402 A1 | 2/2024 | Bafna et al. | |
| 2024/0039406 A1 | 2/2024 | Chen et al. | |
| 2024/0048048 A1 | 2/2024 | Zhang | |
| 2024/0055488 A1 | 2/2024 | Lee et al. | |
| 2024/0067116 A1 | 2/2024 | Qiu | |
| 2024/0072675 A1 | 2/2024 | Formenti et al. | |
| 2024/0072817 A1 | 2/2024 | K et al. | |
| 2024/0077899 A1 | 3/2024 | Chitnis et al. | |
| 2024/0078204 A1 | 3/2024 | Roehrle et al. | |
| 2024/0079950 A1 | 3/2024 | Narayanasamy | |
| 2024/0079958 A1 | 3/2024 | Kumar et al. | |
| 2024/0080028 A1 | 3/2024 | Dake et al. | |
| 2024/0088647 A1 | 3/2024 | Ramadass et al. | |
| 2024/0088896 A1 | 3/2024 | Bilhan et al. | |
| 2024/0097437 A1 | 3/2024 | Goyal et al. | |
| 2024/0097459 A1 | 3/2024 | Swoboda et al. | |
| 2024/0105276 A1 | 3/2024 | Duryea | |
| 2024/0106248 A1 | 3/2024 | Woll et al. | |
| 2024/0106435 A1 | 3/2024 | Zhang et al. | |
| 2024/0113517 A1 | 4/2024 | Sriraj et al. | |
| 2024/0113611 A1 | 4/2024 | Kaufmann et al. | |
| 2024/0113620 A1 | 4/2024 | Ranmuthu et al. | |
| 2024/0113624 A1 | 4/2024 | Southard et al. | |
| 2024/0120558 A1 | 4/2024 | Zhang et al. | |
| 2024/0120765 A1 | 4/2024 | Oner et al. | |
| 2024/0120962 A1 | 4/2024 | Miriyala et al. | |
| 2024/0128851 A1 | 4/2024 | Ruck et al. | |
| 2024/0128859 A1 | 4/2024 | Chen | |
| 2024/0128867 A1 | 4/2024 | Wang et al. | |
| 2024/0146177 A1 | 5/2024 | Mehdi et al. | |
| 2024/0146306 A1 | 5/2024 | Ramkaj et al. | |
| 2024/0149734 A1 | 5/2024 | Eisenlauer | |
| 2024/0162723 A1 | 5/2024 | Zipf et al. | |
| 2024/0178756 A1 | 5/2024 | El-Markhi et al. | |
| 2024/0178824 A1 | 5/2024 | Kazama et al. | |
| 2024/0186803 A1 | 6/2024 | Krieg et al. | |
| 2024/0198937 A1 | 6/2024 | Benqassmi et al. | |
| 2024/0198938 A1 | 6/2024 | Carlos et al. | |
| 2024/0204540 A1 | 6/2024 | Majmunovic et al. | |

(56) References Cited

U.S. PATENT DOCUMENTS

| | | |
|---|---|---|
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |
| 2024/0213975 A1 | 6/2024 | Narayanasamy |
| 2024/0213981 A1 | 6/2024 | Agarwal et al. |

FOREIGN PATENT DOCUMENTS

| | | |
|---|---|---|
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

Balogh, L., "Fundamentals of MOSFET and IGBT Gate Driver Circuits," Texas Instruments Application Report, SLUA618-March (2017), Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

* cited by examiner

SYSTEMS AND METHODS FOR GALVANIC ISOLATION FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for galvanic isolation for an inverter for an electric vehicle, and, more particularly, to systems and methods for a galvanic isolation circuit for common-mode noise rejection and a wide range of common-mode transient immunity (CMTI) tolerance.

BACKGROUND

Inverters, such as those used to drive a motor in an electric vehicle, for example, are responsible for converting High Voltage Direct Current (HVDC) into Alternating Current (AC) to drive the motor. In an inverter, electromagnetic interference issues, such as common-mode radio frequency interference arising due to radio frequency noise being coupled or induced into a high voltage (non-ground referenced) operating plane, can compromise the correct operation of galvanic transceivers.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a first galvanic isolator separating a low voltage area from a high voltage area, the first galvanic isolator having a first galvanic isolator output path; a second galvanic isolator separating the low voltage area from the high voltage area, the second galvanic isolator having a second galvanic isolator output path; an amplifier in the high voltage area, connected to the first galvanic isolator via the first galvanic isolator output path, and connected to the second galvanic isolator via the second galvanic isolator output path, the amplifier having a first amplifier output path and a second amplifier output path; a comparator in the high voltage area, and connected to the amplifier via the first amplifier output path and the second amplifier output path, the comparator having a first comparator output path and a second comparator output path; and a pulse reshape and envelope detector in the high voltage area, and connected to the comparator via the first comparator output path and the second comparator output path.

In some aspects, the techniques described herein relate to a system, further including: a pulse transceiver in the low voltage area, the pulse transceiver connected to the first galvanic isolator via a first pulse transceiver output path and connected to the second galvanic isolator via a second pulse transceiver output path.

In some aspects, the techniques described herein relate to a system, wherein the pulse transceiver, the amplifier, the comparator, and the pulse reshape and envelope detector are configured to operate together to transmit a Pulse Width Modulation signal from the low voltage area to the high voltage area.

In some aspects, the techniques described herein relate to a system, wherein the pulse transceiver is configured to output a first pulse on the first pulse transceiver output path and a second pulse on the second pulse transceiver output path.

In some aspects, the techniques described herein relate to a system, wherein the pulse transceiver is further configured to receive a primary pulse, and output the first pulse and the second pulse, based on the received primary pulse.

In some aspects, the techniques described herein relate to a system, wherein: the first galvanic isolator is configured to receive the first pulse on the first pulse transceiver output path, and send a first galvanic isolator pulse on the first galvanic isolator output path based on the received first pulse, and the second galvanic isolator is configured to receive the second pulse on the second pulse transceiver output path, and send a second galvanic isolator pulse on the second galvanic isolator output path based on the received second pulse.

In some aspects, the techniques described herein relate to a system, wherein the amplifier is configured to: receive the first galvanic isolator pulse on the first galvanic isolator output path, amplify the first galvanic isolator pulse based on one or more properties of the amplifier, and send a first amplified pulse on the first amplifier output path based on the amplified first galvanic isolator pulse, and receive the second galvanic isolator pulse on the second galvanic isolator output path, amplify the second galvanic isolator pulse based on one or more properties of the amplifier, and send a second amplified pulse on the second amplifier output path based on the amplified second galvanic isolator pulse.

In some aspects, the techniques described herein relate to a system, wherein the comparator is configured to: receive the first amplified pulse on the first amplifier output path, receive the second amplified pulse on the second amplifier output path, perform a comparison of the first amplified pulse with the second amplified pulse, output a first compared pulse on the first comparator output path based on the comparison, and output a second compared pulse on the second comparator output path based on the comparison.

In some aspects, the techniques described herein relate to a system, wherein the pulse reshape and envelope detector is configured to: receive the first compared pulse on the first comparator output path, receive the second compared pulse on the second comparator output path, and output an output pulse based on the first compared pulse and the second compared pulse.

In some aspects, the techniques described herein relate to a system, wherein the amplifier includes: a trimmer, and a tunable filter.

In some aspects, the techniques described herein relate to a system, further including: an out-of-range detector connected to the first galvanic isolator, the second galvanic isolator, and the pulse reshape and envelope detector.

In some aspects, the techniques described herein relate to a system, wherein the comparator further includes a resistor averaging circuit.

In some aspects, the techniques described herein relate to a system, further including: the battery configured to supply the DC power to the inverter; and the motor configured to receive the AC power from the inverter to drive the motor.

In some aspects, the techniques described herein relate to a method including: receiving, by one or more controllers, a first pulse, and transmitting, by the one or more controllers, a first galvanic isolator pulse based on the first pulse; receiving, by the one or more controllers, a second pulse, and transmitting by the one or more controllers, a second galvanic isolator pulse based on the second pulse; receiving, by the one or more controllers, the first galvanic isolator pulse and the second galvanic isolator pulse; generating, by the one or more controllers, a first amplified pulse based on the first galvanic isolator pulse and a second amplified pulse based on the second galvanic isolator pulse; receiving, by the one or more controllers, the first amplified pulse and the second amplified pulse; comparing, by the one or more controllers, the first amplified pulse and the second amplified pulse; determining, by the one or more controllers, a mitigation action based on the comparing; and generating, by the one or more controllers, an output pulse based on the mitigation action.

In some aspects, the techniques described herein relate to a method, wherein the determining the mitigation action includes: determining, by the one or more controllers, a difference between one or more signal properties of the first amplified pulse and one or more signal properties of the second amplified pulse; comparing, by the one or more controllers, the difference to a difference threshold; and determining, by the one or more controllers, the mitigation action based on the comparing the difference to the difference threshold.

In some aspects, the techniques described herein relate to a method, wherein the generating the output pulse includes maintaining a previous signal state based on one or more of a previous first galvanic isolator pulse or a previous second galvanic isolator pulse.

In some aspects, the techniques described herein relate to a method, further including: trimming, by the one or more controllers, one or more of the first galvanic isolator pulse or the second galvanic isolator pulse.

In some aspects, the techniques described herein relate to a method, further including: determining, by the one or more controllers, one of an in-range indication or an out-of-range indication based on the first galvanic isolator pulse and the second galvanic isolator pulse.

In some aspects, the techniques described herein relate to a method, wherein the generating the output pulse includes generating the output pulse based on the one of the in-range indication or the out-of-range indication.

In some aspects, the techniques described herein relate to a system including: a first galvanic isolator configured to receive a first pulse from a pulse transceiver and output a first galvanic isolator pulse based on the received first pulse; a second galvanic isolator configured to receive a second pulse from the pulse transceiver and generate a second galvanic isolator pulse based on the received second pulse; an amplifier configured to receive the first galvanic isolator pulse and the second galvanic isolator pulse, amplify the first galvanic isolator pulse and the second galvanic isolator pulse as a first amplified pulse and a second amplified pulse, respectively, and output the first amplified pulse and the second amplified pulse; a comparator configured to receive the first amplified pulse and the second amplified pulse, perform a comparison of the first amplified pulse to the second amplified pulse, and generate a first compared pulse and a second compared pulse, respectively, based on the comparison; and a pulse reshape and envelope detector configured to receive the first compared pulse and the second compared pulse, and generate an output pulse based on the first compared pulse and the second compared pulse.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
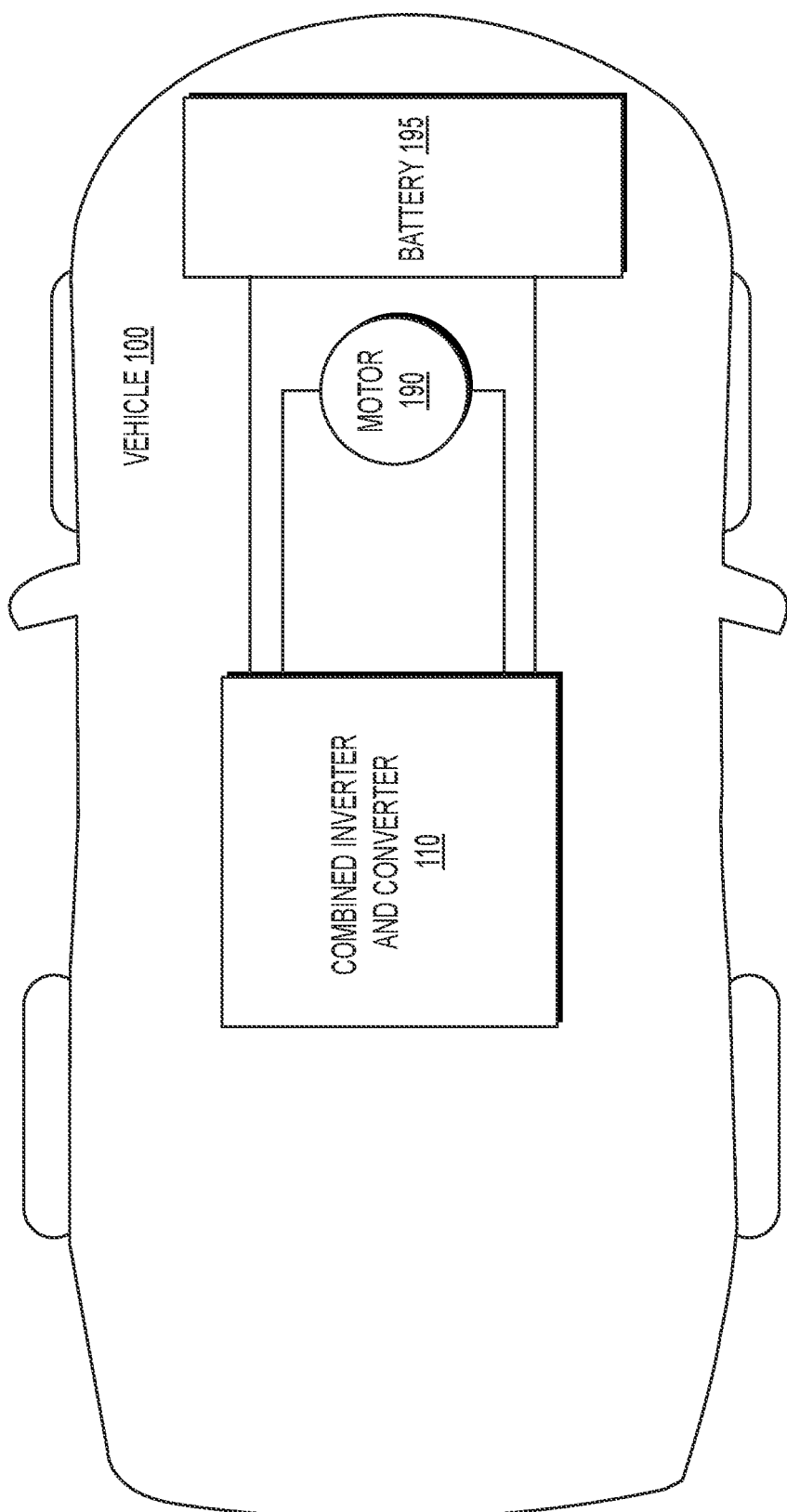
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for galvanic isolation, and more specifically, to a galvanic isolation circuit for common-mode noise rejection and a wide range of common-mode transient immunity (CMTI) tolerance, as may be applied to electronic systems and/or components such as those used for electric vehicles.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three phase switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the phase switches. The phase switches may drive the phase voltage. The inverter may include an isolation barrier between low voltage and high voltage planes. Signals may pass from the PWM controller to the phase switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the phase switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5 A to 15 A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

As introduced above, galvanic isolation may include isolating functional sections of electrical systems to prevent current flow such that, for example, no direct conduction path is permitted between such functional sections. For example, two circuits may be galvanically isolated such that the circuits are configured to communicate with each other, but may have respective reference grounds at different potentials. For example, some architectures use a circuit with four galvanic isolators, such as four capacitors, for transferring data between low voltage and high voltage planes. The galvanic isolation may include optical, transformer-based, or capacitance-based isolation, for example.

A gate driver may be a power amplifier or other electrical component that accepts a low power input from a controller, and may produce a high-current drive input for the gate of a high-power transistor, such as a half-H bridge switch as discussed above. Galvanically isolated gate drivers may be used in automotive and industrial applications for communication between low voltage and high voltage planes, without causing harm to users or equipment.

One or more embodiments may address electromagnetic interference (EMI) that may compromise operation of galvanic transceivers. For example, common-mode transient immunity (CMTI) is a measurable metric for galvanic transceivers, and applicable industry standards describe applicable CMTI capability testing and requirements. One or more embodiments may address a wide range of CMTI tolerances. One or more embodiments may address electromagnetic compatibility (EMC) concerns such as common-mode radio frequency interference (CMRFI) arising due to radio frequency (RF) noise being coupled or induced into a high voltage (e.g., a non-ground referenced voltage) operating plane, which may compromise the operation of galvanic transceivers. One or more embodiments may address common-mode noise rejection.

One or more embodiments may address EMC issues including long-duration common-mode transient immunity (LD-CMTI) events, which may be longer in duration than the traditional CMTI. Such events may be caused due to the switching of high voltage field effect transistors (FETs) in a phase switch (e.g., a half H-bridge) configuration. One or more embodiments may address slewing events that may last from approximately 100 nanoseconds up to approximately 300 nanoseconds, and may cause the inputs of a receiver to be driven out-of-range, which may disrupt communication for an extended period.

One or more embodiments may include circuit architectures to address interference such as CMTI, CMRFI, or LD-CMTI, for example. According to one or more embodiments, CMRFI may be addressed by implementing a first input stage to a galvanic receiver with given attributes. Such attributes may include filtering and not responding to common-mode RF signals generated in a gate drive systems that appear as a differential signal. A differential signal may be due to imbalanced galvanic isolators or other mismatches including parasitics present in a signal path.

An input to a gate drive system may be trimmed to null out differences in current which are produced by interference, such as differences based on or detected based on noise and/or mismatched galvanic isolator outputs, parasitic capacitance, and/or inductance associated with, for example, electromagnetic interface caused by one or more electrical components. Such interference may be caused by, for example, high voltage side components of an electrical system. The interference may be based on a trace and/or mismatch at one or more front end amplifiers. An input to a gate terminal may be trimmed to null out such interference such that it has no effect on an output PWM signal, as output by the gate drive system. Accordingly, the resulting PWM signal may not be based on a net differential component.

One or more embodiments may include a resistor average circuit provided prior to a comparator to provide an additional offset difference between two inputs. Such a resistor average circuit may mitigate effects of CMTI and/or CMRFI.

According to one or more embodiments, issues arising from LD-CMTI may be solved or mitigated, in accordance with the techniques and designs disclosed herein, using an out-of-range detector to generate an output from a gate drive system. The out-of-range detector may trigger a sample and hold circuit to hold its previous state based on detecting an out-of-range signal. Detecting an out-of-range signal may trigger the out-of-range detector to cause a circuit to hold a previous state, thus preventing or mitigating an output from experiencing a glitch event during a slew event (e.g., a long slew event of approximately 300 nanoseconds). A slew event may be an event where interference signals cause an unintended input, for example, outside the range of allowed signal inputs, as detected by the out-of-range detector. A threshold for a long slew event may be a function of high voltage capacitance, frequency and amplitude of a drive signal, package parasitics, and other parameters such as power and area, for example.

Accordingly, one or more embodiments may provide a system configured to tolerate a wide range of CMTI events. For example, a CMTI rating of a minimum of approximately 5V/ns to approximately 300V/ns and use of CMTI pulses that are not longer than approximately 13 ns may be used to designate optimal or target performance. The techniques and designs disclosed herein may provide a sample and hold structure that holds a previous state of the output during a CMTI event. The techniques and designs disclosed herein have been tested and may perform up to a CMTI duration of approximately 30 ns, hence providing a wide coverage for CMTI (e.g., from approximately 5V/ns to approximately 300V/ns).

The techniques and designs provided herein may provide a system configured to tolerate a CMRFI event with various frequency and peak-peak amplitude ranges. These techniques and designs may include adding an additional offset to an input pair of signals as well as through a resistor average circuit, which compares the outputs of amplifiers to offset and an average value of the resistor average circuit. The techniques and designs provided herein may be implemented using a pair of galvanic isolators for bidirectional communication.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
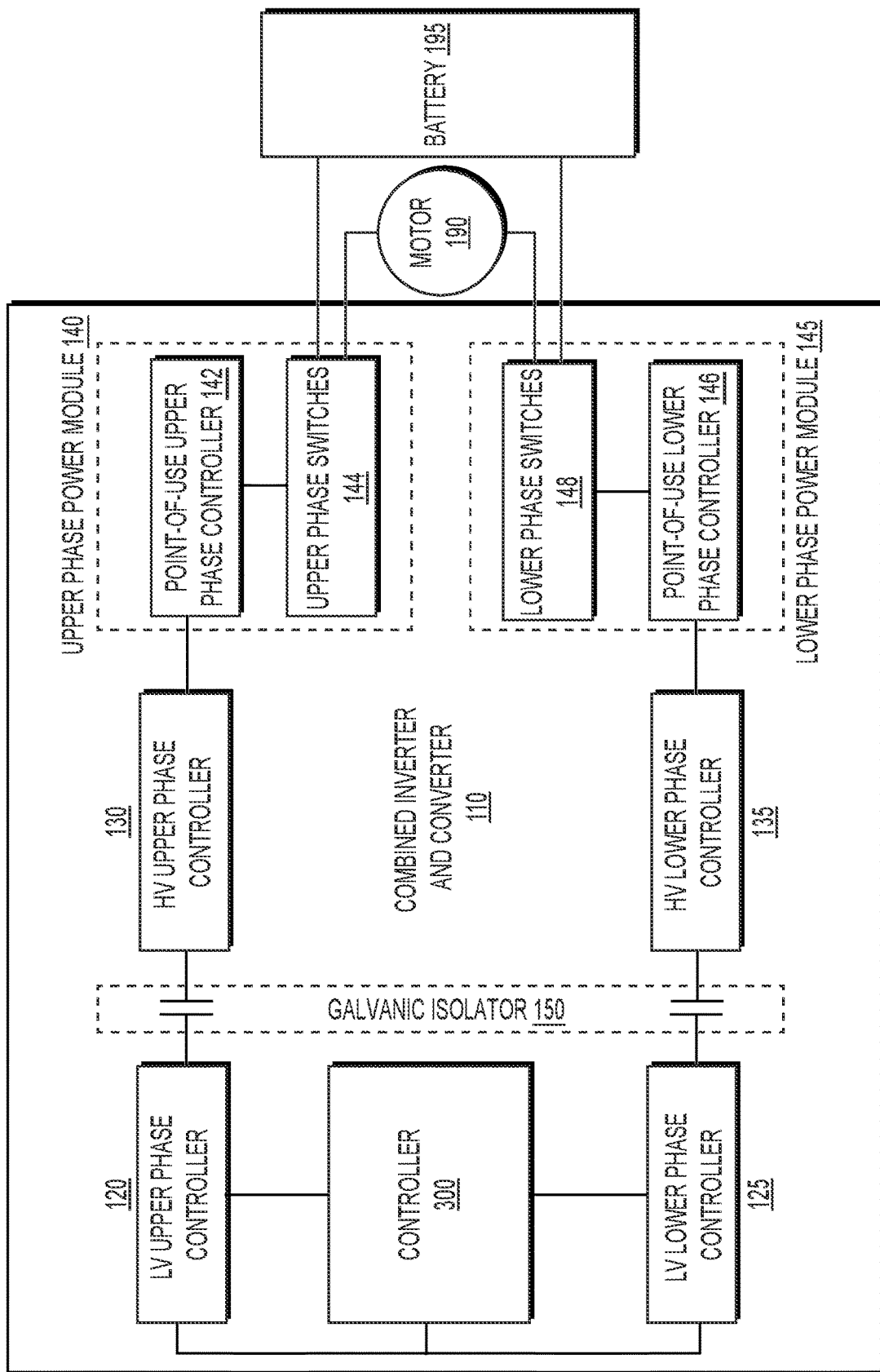
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries a 180-degree phase shifted data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
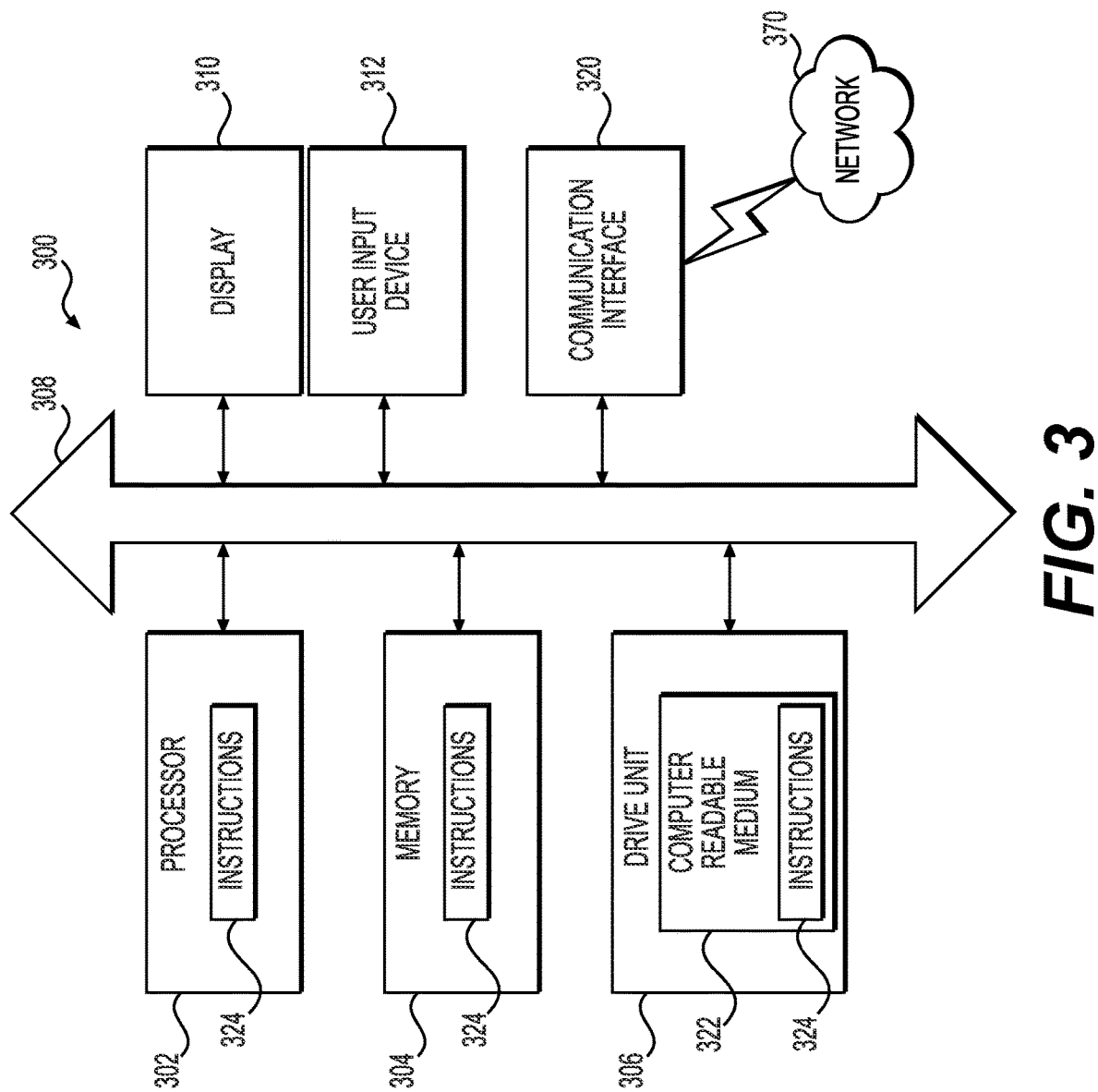
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, a touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
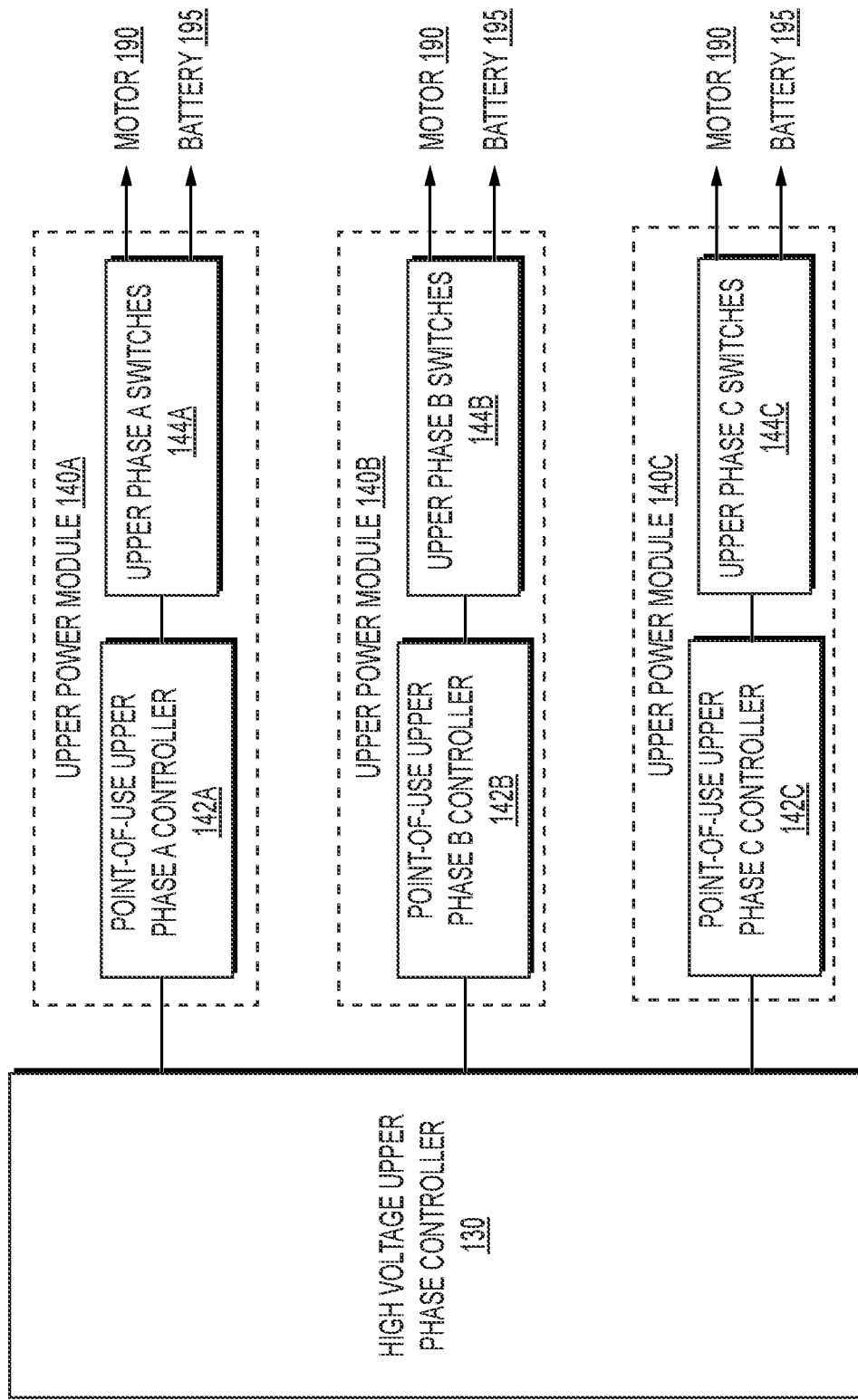
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
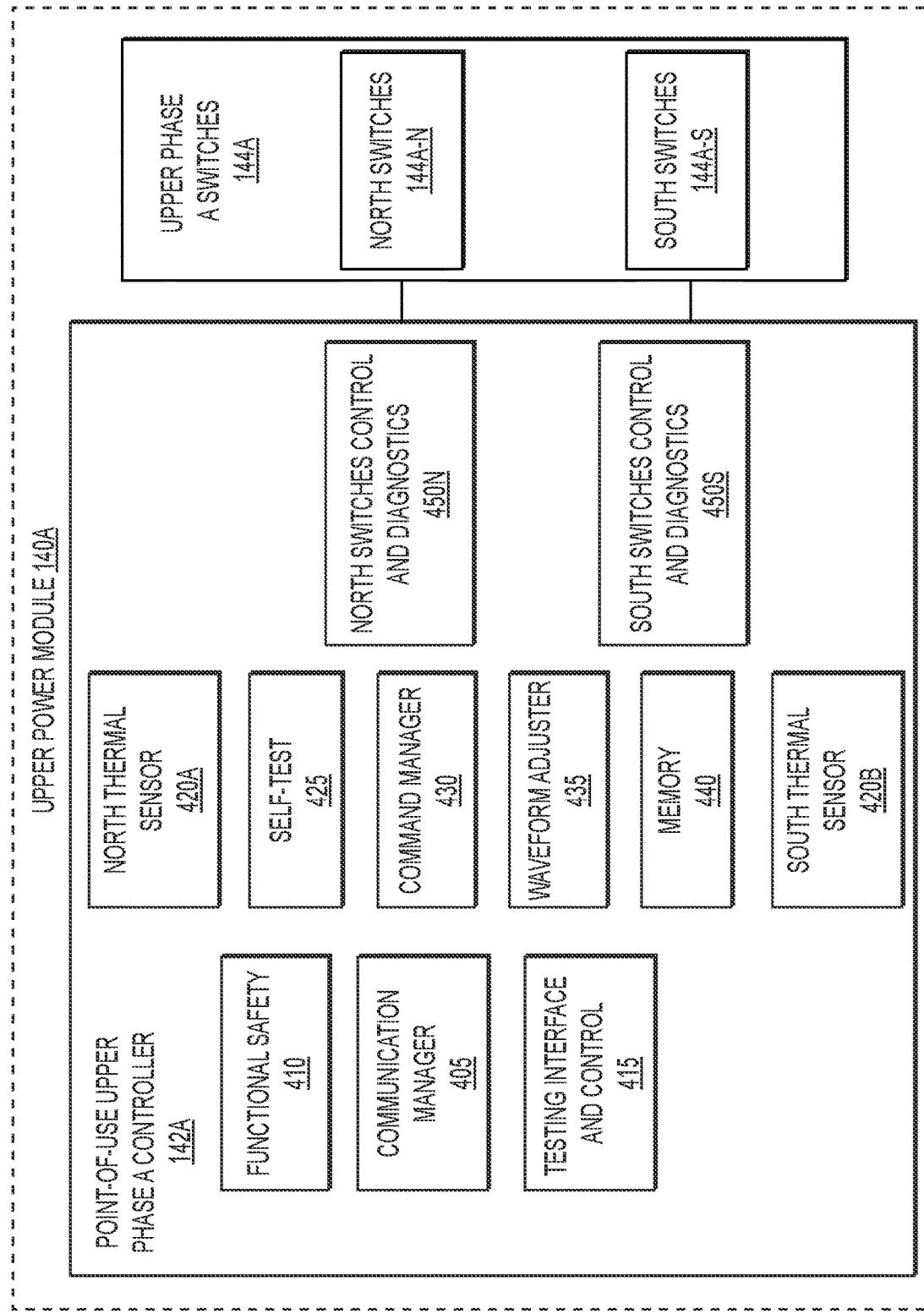
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
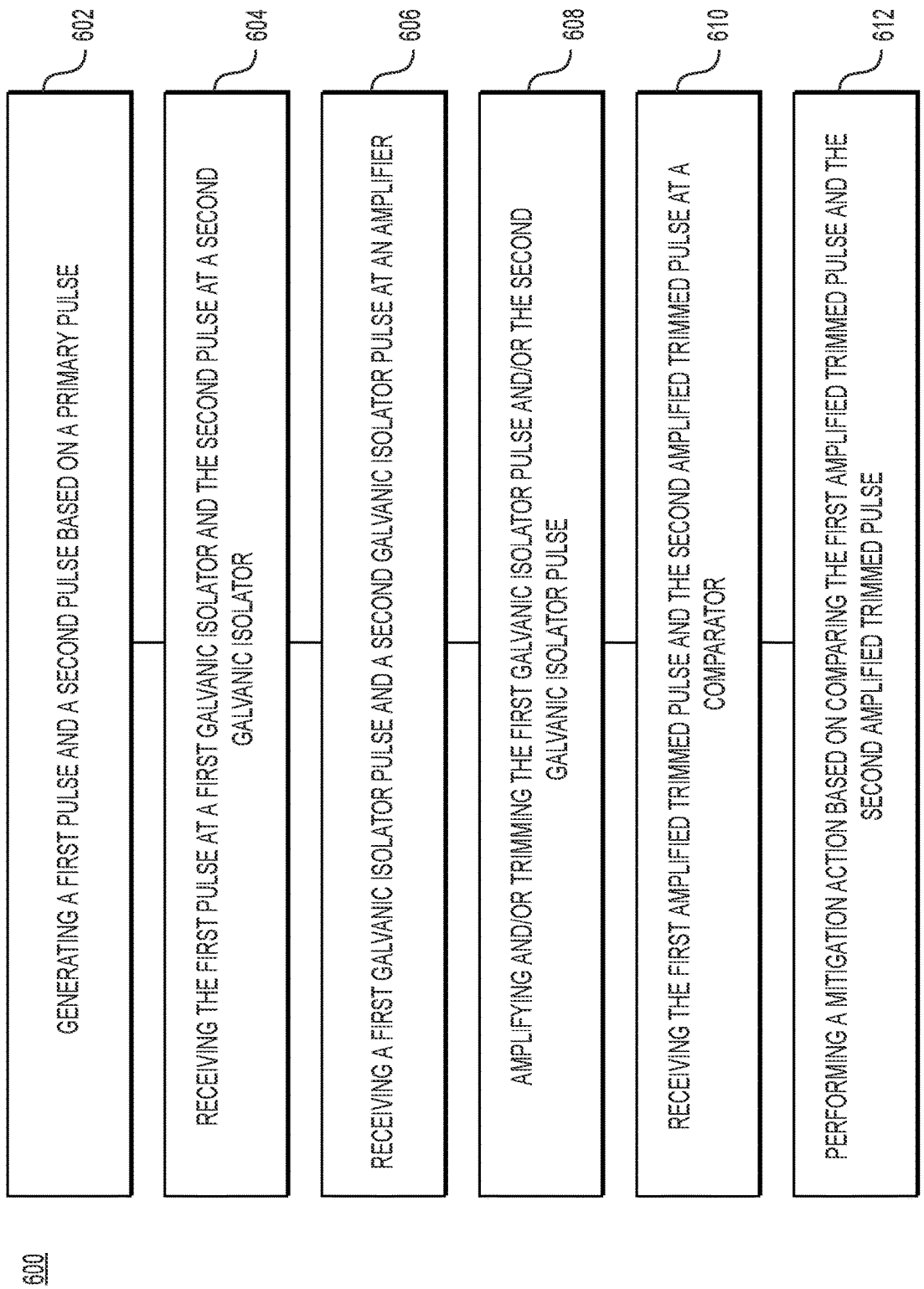
FIG. 6 depicts an exemplary method for reducing interference effects from electrical components, according to one or more embodiments.

FIG. 6 depicts an exemplary method 600 for reducing interference effects, such as one or more of CMRFI, CMTI, or LD-CMTI, for example. In operation 602, a pulse transceiver (e.g., a controller transceiver) may generate a first pulse and a second pulse, based on a primary pulse. The first pulse and the second pulse may be generated based on, for example, a supply amplitude voltage and a PWM-in signal, relative to a ground signal. The first pulse and the second pulse may be generated by the pulse transceiver to control an input sense terminal and/or to indicate that a subsequent control signal is to be received by the gate. The input terminal of the power device may be upper phase switches 144, for example. The pulse transceiver may be located at a low voltage section of an electrical system. For example, with reference to FIG. 2, low voltage upper phase controller 120 may receive a PWM-in signal including a primary pulse from inverter controller 300, and may generate a first pulse and a second pulse based on the received primary pulse.

The first pulse and the second pulse generated at the pulse transceiver in operation 602 may be complementary signals of each other, for example. The first pulse and the second pulse may be transmitted via two different electrical paths, including a first path for the first pulse and a second path for the second pulse. In operation 604, a first pulse may be received at a first galvanic isolator via the first path, and a second pulse may be received at a second galvanic isolator via the second path. The first path and/or the first galvanic isolator may be physically separated from the second path and/or the second galvanic isolator, and placed close to each other so that any noise affecting them may be interpreted by the receiver as a common mode signal. For example, the distance between the first galvanic isolator and the second galvanic isolator may be a maximum distance such that electrical interference (e.g., generated via electrical components) has a first effect on the first pulse at the first galvanic isolator, and a second effect, identical to the first effect, on the second pulse at the second galvanic isolator. The first effect and the second effect may be, for example, changes in signal properties, such as changes in frequency or changes in amplitude, for example. The difference between the first effect and the second effect may meet a detection threshold to be detected by a comparator, as further discussed herein.

In operation 606, a first galvanic isolator pulse may be output from the first galvanic isolator and received at an amplifier, and a second galvanic isolator pulse may be output from the second galvanic isolator and may be received at the amplifier. Accordingly, the amplifier may receive the first pulse and the second pulse, after the first pulse and the second pulse traverse the first and second path, respectively, and pass through the first and second galvanic isolator, respectively.

In operation 608, the amplifier may amplify the first galvanic isolator pulse and the second galvanic isolator pulse based on one or more amplifier properties. For example, the amplifier may increase the voltage, current, and/or power of the first galvanic isolator pulse and the second galvanic isolator pulse, respectively. The amplifier may include a trimmer. In operation 608, the amplifier may trim the first galvanic isolator pulse and the second galvanic isolator pulse using the trimmer. The amplifier may include one or more electrical components to filter noise signals. Accordingly, the amplifier may filter noise frequencies from the first galvanic isolator pulse and the second galvanic isolator pulse. The one or more electrical components of the amplifier may be configured to filter signals that are outside a range of given frequencies. For example, the amplifier may include one or more tunable band pass filters, one or more tunable low-pass filters, one or more tunable high-pass filters, one or more tunable notch filters, or any combination thereof. For example, after a first stage of amplification, the amplified output may be fed to a filter. The cutoff frequency and order of filter may be set based on the noise frequency that should be rejected. For example, if a data rate is 50 MHz and noise below 30 MHz should be rejected, the filter might include a band pass filter centered around 50 MHz. The trimmer might be dynamically adjustable to enforce a known offset between DC values of the first galvanic isolator and the second galvanic isolator. The dynamic trim operation may include adjusting a DC offset between the first galvanic isolator and the second galvanic isolator, which may be adjusted by varying either the load resistor or aspect ratio of input pairs dynamically. A known number of pulses may either be fed to the low voltage side PWM input or a low voltage controller may generate a known number of pulses during the trim routine. A sinusoidal noise signal with a predetermined amplitude and frequency may be applied to the high voltage ground. The number of pulses may be counted at an output of the high voltage receiver, and used to adjust a load resistor or aspect ratio if needed, as described in the description of FIG. 9.

In operation 610, the amplifier may output a first amplified trimmed pulse corresponding to the first galvanic isolator pulse, and may output a second amplified trimmed pulse corresponding to the second galvanic isolator pulse. Although amplified trimmed pulses are generally discussed herein, amplified pulses and/or trimmed pulses may be output by the amplifier based on operations conducted at the amplifier. For example, a galvanic isolator pulse may be amplified to generate an amplified pulse, or a galvanic isolator pulse may be trimmed to generate a trimmed pulse. Each of the first amplified trimmed pulse and the second amplified trimmed pulse may be provided to a comparator. The comparator may include one or more electrical components to compare signal properties of the first amplified trimmed pulse with signal properties of the second amplified trimmed pulse. For example, the comparator may compare one or more of amplitudes, frequencies, or phases, of the first amplified trimmed pulse and the second amplified trimmed pulse.

In operation 612, the comparator may determine whether the difference in signal properties of the first amplified trimmed pulse and the signal properties of the second amplified trimmed pulse is within a threshold difference. The threshold difference may be a function of a size of a galvanic isolation capacitor, or a frequency and amplitude of noise coupling from the high voltage side, for example. When a difference in signal properties of the first amplified trimmed pulse and the signal properties of the second amplified trimmed pulse is below the threshold difference, the comparator may take a first mitigation action, which may include outputting the first amplified trimmed pulse and the second amplified trimmed pulse to a pulse reshape and envelope detector. Alternatively, when the difference in signal properties of the first amplified trimmed pulse and the signal properties of the second amplified trimmed pulse is above the threshold difference, then the comparator may take a second mitigation action, the second mitigation action being different from the first mitigation action. The second mitigation action may include, for example, hysteresis. As discussed herein, hysteresis may be used to prevent use of input pulses that exhibit quick successive changes (e.g., based on signal interference, as discussed herein).

According to one or more embodiments, the comparator may include or may be connected to a resistor average circuit. The resistor average circuit may be part of the comparator or may be separate from the comparator. The resistor average circuit may provide an average of the signals received from two amplifiers, and an offset may be added to this averaged signal. The averaged signal may then be compared with the individual amplifier signals. Because the output of the amplifiers are complementary, only a valid signal at the input of the amplifier (e.g. a signal greater than 60 mV) will have enough amplification at the output of the amplification stage to cross the average signal with offset generated by the resistor average circuit. Any false signals generated due to CMRFI or CMTI would not have enough amplitude to cross the averaged signal with offset. The resistor average circuit may add an additional offset of approximately 100 mV, for example. The outputs of the two comparators may be provided to an AND gate so that only a complementary signal at the input of the first stage amplifier can pass through. Accordingly, an output of the resistor average circuit may be used to provide additional immunity against CMTI and CMRFI.

The resistor average circuit requires two complementary signals. The outputs of the amplifiers are then passed through the resistor average circuit as described above. The output of the comparators present in the resistor average circuit are provided to an AND gate so that only complementary signals at the input of the first stage amplifiers can pass through. Thus, the envelope detector circuit would see a pulse only if the inputs to the amplifiers are complementary.

Figure 10:
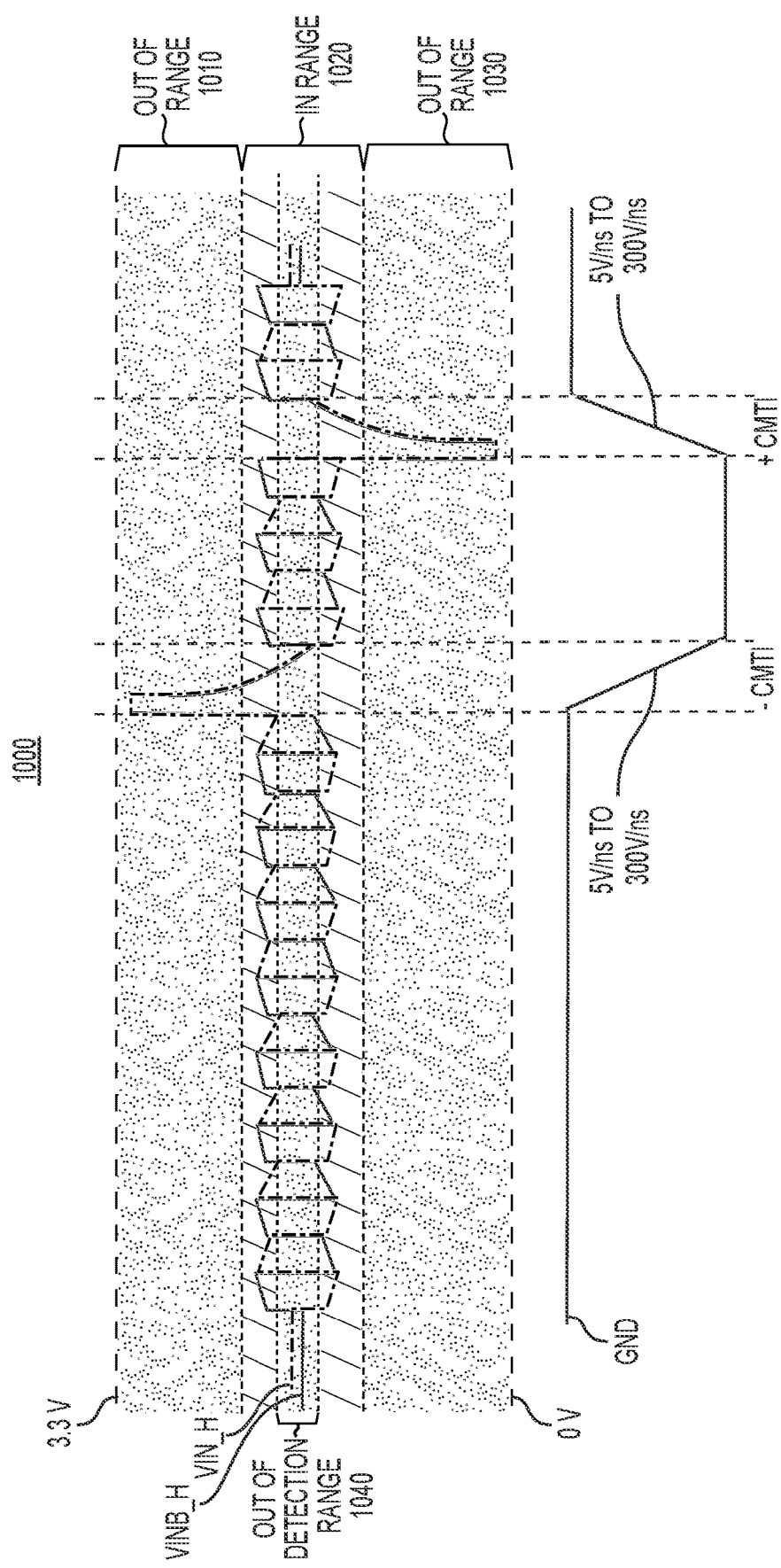
FIG. 10 depicts an exemplary operation of out-of-range detector, according to one or more embodiments.

According to one or more embodiments, the first galvanic isolator pulse and the second galvanic isolator pulse may be provided to an out-of-range detector (see FIG. 10). The out-of-range detector may determine whether the amplitude of the first galvanic isolator pulse and/or the second galvanic isolator pulse is within a threshold amplitude range (e.g., from approximately 1V to approximately 2.6V). When the amplitude range of the first galvanic isolator pulse and/or the second galvanic isolator pulse is within the threshold amplitude range, then the out-of-range detector may transmit an in-range indication. When the amplitude of the first galvanic isolator pulse and/or the second galvanic isolator pulse is not within the threshold amplitude range, then the out-of-range detector may transmit an out-of-range indication. The in-range indication or out-of-range indication may be received by the pulse reshape and envelope detector.

The pulse reshape and envelope detector may use the first amplified trimmed pulse and the second amplified trimmed pulse corresponding to the first galvanic isolator pulse and the second galvanic isolator pulse, respectively, when an in-range indication is received. Alternatively, the pulse reshape and envelope detector may not use the first amplified trimmed pulse and/or the second amplified trimmed pulse corresponding to the first galvanic isolator pulse and the second galvanic isolator pulse, respectively, when an out-of-range indication is received. When an out-of-range indication is received, the pulse reshape and envelope detector may hold a current state (e.g., based on a previous in-range indication) to keep or generate a PWM out signal. The envelope detector may include a rectifier and an RC filter, for example. By adjusting the pulse width or RC time constant, the envelope can be recreated. A stream of pulses may either turn on or off two switches that connect a capacitor to either a supply or ground. By adjusting the duty cycle of the incoming data pulse or RC time constant, an envelope can be recreated. The output of the rectifier may be further filtered, and the amplitude may be enhanced to a full supply range before being output to a final comparator.

The pulse reshape and envelope detector may generate a PWM out signal based on one or both of the first amplified trimmed pulse and the second amplified trimmed pulse. The PWM out signal may be generated by, for example, re-shaping the first amplified trimmed pulse and/or the second amplified trimmed pulse, by generating a PWM signal using one or both of the first amplified trimmed pulse and the second amplified trimmed pulse. The generation of the PWM signal may include one or more of selecting one or the other of the first amplified trimmed pulse and the second amplified trimmed pulse, by averaging both, or by performing an operation on one or both. According to one or more embodiments, a signal associated with the first amplified trimmed pulse and or the second amplified trimmed pulse (e.g., a signal transmitted by the pulse transceiver) may be included or otherwise used based on the PWM out signal.

It will be understood that any operation (e.g., such as those disclosed in reference to FIG. 6) disclosed herein are not limited to be performed any specific order or sequence. Any order or sequence disclosed herein is only disclosed as an example, and one or more of the operations (e.g., of a given process) may be performed in any applicable manner, as understood by one skilled in the art.

Accordingly, the techniques disclosed in the method 600 of FIG. 6 may be used to mitigate or prevent use of pulses that may be modified as a result of interference. These techniques may prevent or mitigate unwanted effects of one or more of CMTI, CMRI, or LD-CMTI. These techniques may include comparing two parallel pulses generated by a pulse transceiver. The comparison may include determining differences between the two parallel pulses, where the two parallel pulses may be identical, similar, complementary, or inverse, when generated at the pulse transceiver. Interference caused by electrical components may cause signal properties for the two parallel pulses to drift, such that comparing the two parallel pulses may identify the level of drift, if any. For example, interference caused by electrical components may have a different effect on the first galvanic isolator and/or first galvanic isolator signal when compared to a physically distant second galvanic isolator and/or corresponding second galvanic isolator signal. When differences above a threshold difference are detected, a determination may be made that unwanted interference effects are present. An output signal may not be generated based on pulses exhibiting such interference effects. Accordingly, circuits in accordance with the techniques disclosed herein may not generate outputs (e.g., PWM outputs) based on pulse signals exhibiting unwanted interference effects.

Figure 7:
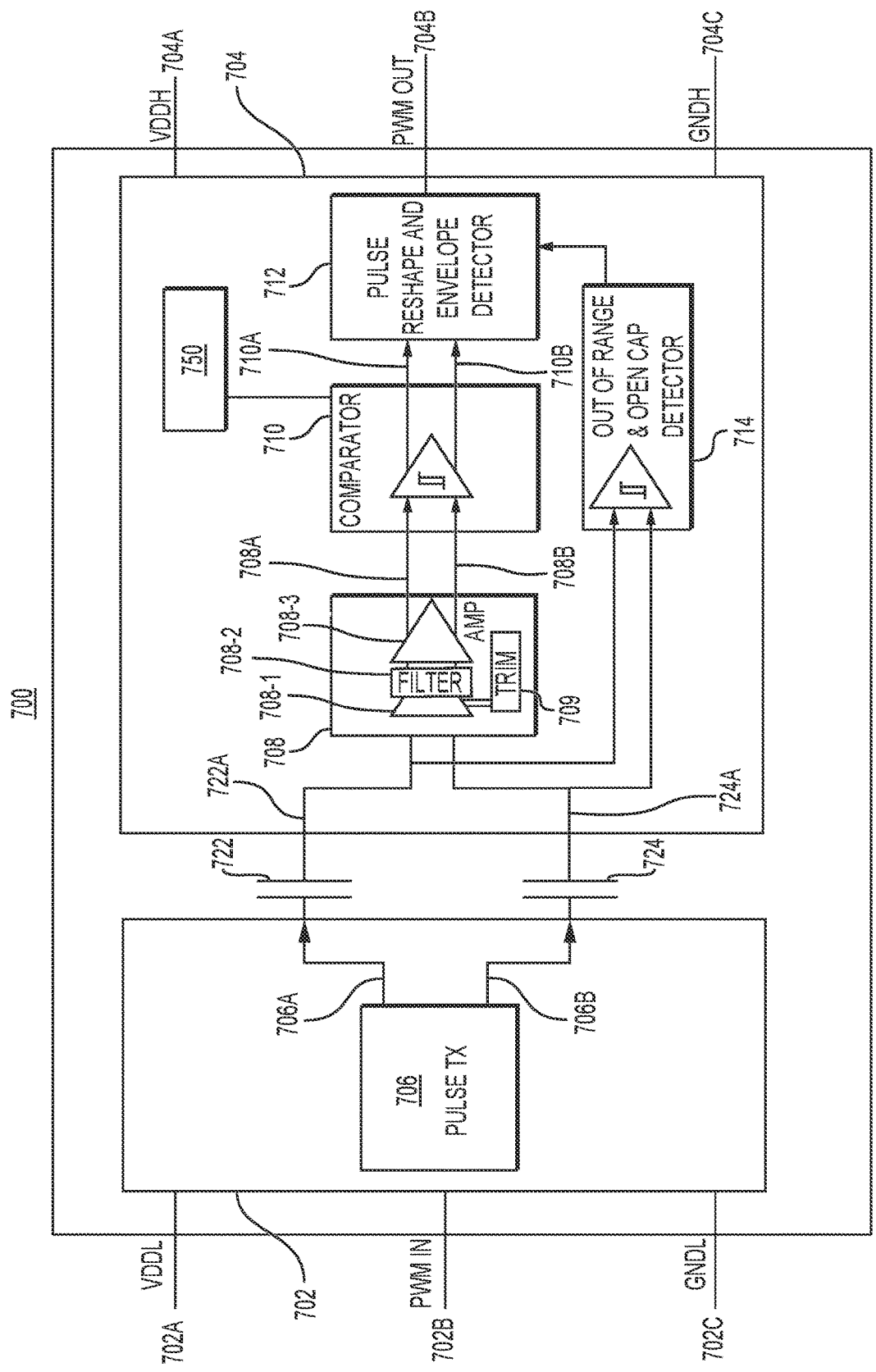
FIG. 7 depicts an exemplary controller for reducing interference effects from electrical components, according to one or more embodiments.

FIG. 7 depicts an exemplary phase controller 700 in accordance with the disclosed subject matter. With reference to FIG. 2, phase controller 700 may be an implementation of low voltage upper phase controller 120 and high voltage upper phase controller 130, for example. As shown in FIG. 7, phase controller 700 may include a low voltage area 702 and a high voltage area 704. Low voltage area 702 and high voltage area 704 may be implementations of low voltage upper phase controller 120 and high voltage upper phase controller 130, respectively. The low voltage area 702 may include, be connected to, or be otherwise associated with low voltage components relative to high voltage area 704. Low voltage area 702 may be referenced herein as a primary area and high voltage area 704 may be referenced herein as a secondary area. Low voltage area 702 may include a pulse transceiver 706. Pulse transceiver 706 may include one or more electrical components configured to receive a signal including a primary pulse, based on a drain voltage VDDL 702A, a PWM-in signal 702B, and/or a reference ground GNDL 702C. PWM-in signal 702B may be generated by inverter controller 300, for example. Pulse transceiver 706 may include one or more electrical components configured to output parallel pulses, based on the primary pulse. Pulse transceiver 706 may be configured to output the parallel pulses via a first pulse path 706A and a second pulse path 706B. Accordingly, pulse transceiver 706 may output a first pulse of the parallel pulses via first pulse path 706A and a second pulse of the parallel pulses via second pulse path 706B.

The first pulse may be received at a first galvanic isolator 722 via first pulse path 706A and the second pulse may be received by a second galvanic isolator 724 via second pulse path 706B. First galvanic isolator 722 and second galvanic isolator 724 may be implementations of galvanic isolator 150, for example. First pulse path 706A and/or the first galvanic isolator 722 may be physically separated from second pulse path 706B and/or the second galvanic isolator 724, as discussed herein. First galvanic isolator 722 may output a first galvanic isolator pulse on first galvanic isolator path 722A, and second galvanic isolator 724 may output a second galvanic isolator pulse on second galvanic isolator path 724A. As discussed herein, when interference is present (e.g., as generated by electrical components included in, connected to, or otherwise associated with high voltage area 704), then signal properties of the first galvanic isolator pulse may be different than signal properties of the first galvanic isolator pulse, due to the interference.

The first galvanic isolator pulse and the second galvanic isolator pulse may be received at amplifier 708 of high voltage area 704. Accordingly, the amplifier may receive the first pulse and the second pulse, after the first pulse and the second pulse traverse first pulse path 706A and second pulse path 706B, respectively, pass through first galvanic isolator 722 and second galvanic isolator 724, respectively, and traverse first galvanic isolator path 722A and second galvanic isolator path 724A.

Amplifier 708 may amplify the first galvanic isolator pulse and the second galvanic isolator pulse based on one or more amplifier properties. For example, amplifier 708 may increases the voltage, current, and/or power of the first galvanic isolator pulse and the second galvanic isolator pulse, respectively. Amplifier 708 may include a first stage amplifier 708-1, tunable filter 708-2, second stage amplifier 708-3, and trimmer 709. Amplifier 708 and/or trimmer 709 may trim the first galvanic isolator pulse and the second galvanic isolator pulse. Tunable filter 708-2 may include one or more electrical components to filter noise signals. Accordingly, tunable filter 708-2 may filter noise frequencies from the first galvanic isolator pulse and the second galvanic isolator pulse. The one or more electrical components of tunable filter 708-2 may be configured to filter signals that are outside a range of given frequencies. For example, tunable filter 708-2 may include one or more band pass filters, one or more low-pass filters, one or more high-pass filters, or one or more notch filters, for example. The filters may be configured to remove known noise components, such as upper phase switches 144, for example, and/or may be configured to isolate known signals.

Amplifier 708 may output a first amplified trimmed pulse corresponding to the first galvanic isolator pulse via a first output path 708A, and may output a second amplified trimmed pulse corresponding to the second galvanic isolator pulse via a second output path 708B. Each of the first amplified trimmed pulse and the second amplified trimmed pulse may be provided to a comparator 710 of the high voltage area 704. Comparator 710 may include one or more electrical components to compare signal properties of the first amplified trimmed pulse with the second amplified trimmed pulse. For example, comparator 710 may compare one or more of amplitudes, frequencies, or phases, of the first amplified trimmed pulse and the second amplified trimmed pulse.

Comparator 710 may determine whether the difference in signal properties of the first amplified trimmed pulse and the signal properties of the second amplified trimmed pulse is within a threshold difference. Comparator 710 may extract signal properties of the first amplified trimmed pulse and the signal properties of the second amplified trimmed pulse using one or more electrical components, such as a filter, for example. For example, comparator 710 may be configured to compare voltages, currents, and/or frequencies of the first amplified trimmed pulse and the second amplified trimmed pulse to detect differences between the first amplified trimmed pulse and the second amplified trimmed pulse.

When a difference in signal properties of the first amplified trimmed pulse and the signal properties of the second amplified trimmed pulse is below the threshold difference, then comparator 710 may take a first mitigation action. The first mitigation action may be a pass-through action, by outputting the first amplified trimmed pulse, via a first comparator output path 710A, and the second amplified trimmed pulse, via a second comparator output path 7106, to a pulse reshape and envelope detector 712. Alternatively, when the difference in signal properties of the first amplified trimmed pulse and the signal properties of the second amplified trimmed pulse is above the threshold difference, then comparator 710 may take a second mitigation action, the second mitigation action being different from the first mitigation action. The second mitigation action may include, for example, performing hysteresis. As discussed herein, hysteresis may be used to prevent use of input pulses that exhibit quick successive changes (e.g., based on signal interference, as discussed herein).

Figure 8:
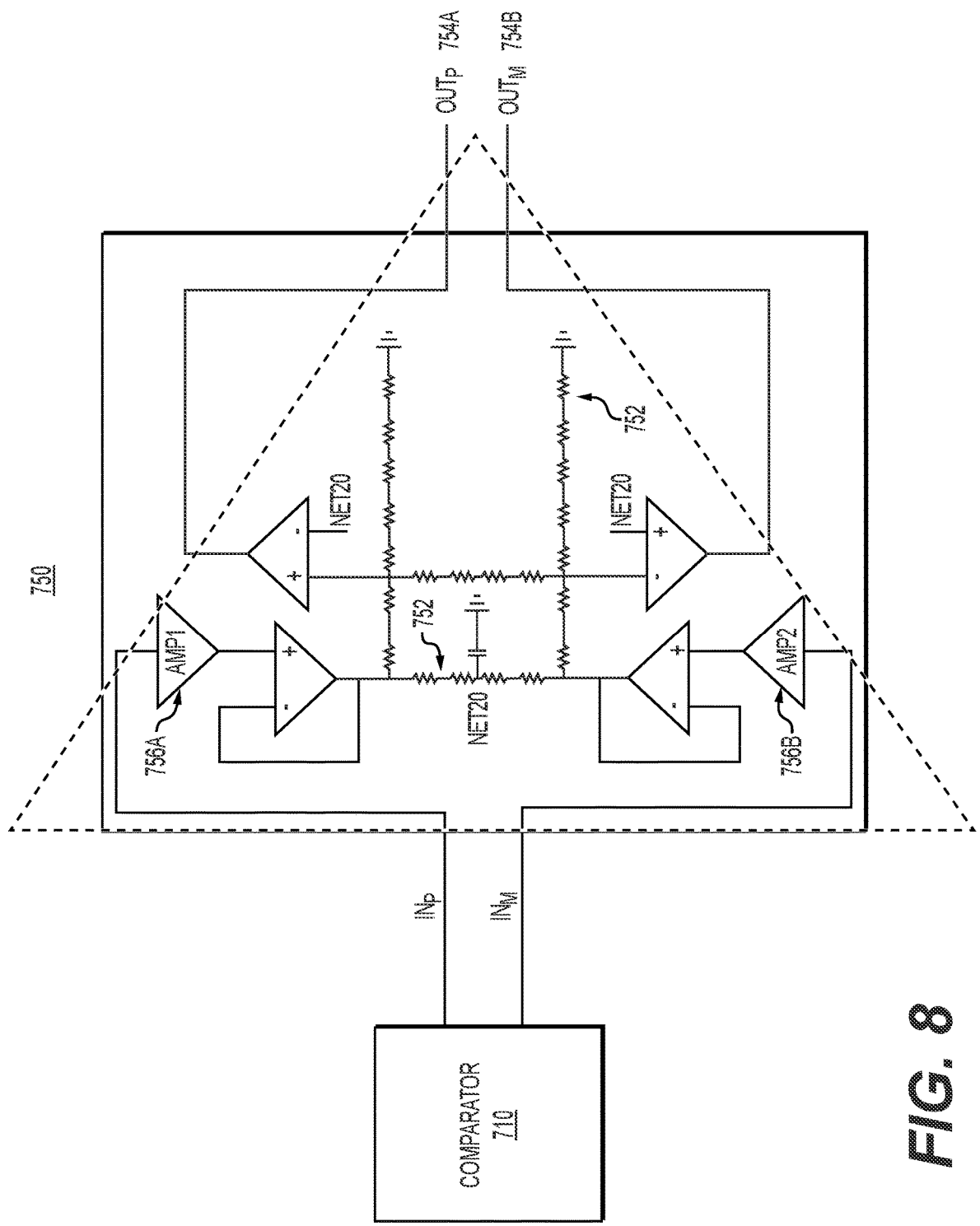
FIG. 8 depicts an exemplary resistor average circuit, according to one or more embodiments.

According to one or more embodiments, comparator 710 may include or be connected to a resistor average circuit 750, as depicted in detail in FIG. 8. Resistor average circuit 750 may be part of comparator 710 or may be separate from comparator 710. As shown in FIG. 8, a first input (e.g., the first amplified trimmed pulse or second amplified trimmed pulse) may be received at first amplifier 756A and a second input (e.g., the first amplified trimmed pulse or second amplified trimmed pulse) may be received at second amplifier 756B. The first input and second input may pass through electrical paths including one or more electrical components. Resistor average circuit 750 may include a plurality of resistors 752 that are configured to provide an offset difference between the first input and the second input (e.g., the first amplified trimmed pulse and the second amplified trimmed pulse), and which may be modified by one or more electrical components. The outputs 754A and 754B of resistor average circuit may be used to determine the mitigation action performed at comparator 710. Accordingly, outputs 754A and 754B of the resistor average circuit may be used to provide additional immunity against CMTI or CMRFI.

The mitigation action may cause comparator 710 to output the first amplified trimmed pulse and a second amplified trimmed pulse. Alternatively, the mitigation action may cause comparator 710 to hold (e.g., via hysteresis) or to prevent outputting a first amplified trimmed pulse and a second amplified trimmed pulse when the difference between the two pulses is above a threshold difference. In this scenario, according to one or more embodiments, comparator 710 may disregard the first amplified trimmed pulse and the second amplified trimmed pulse such that the first amplified trimmed pulse and the second amplified trimmed pulse are not used to generate a PWM out signal, as further discussed herein.

As also shown in FIG. 7, the first galvanic isolator pulse and the second galvanic isolator pulse may be provided to an out-of-range detector 714. Out-of-range detector 714 may determine whether the amplitude of the first galvanic isolator pulse and/or the second galvanic isolator pulse is within a threshold amplitude range. The threshold amplitude may be, for example, from approximately 1V to approximately 2.6V. When the amplitude of the first galvanic isolator pulse and/or the second galvanic isolator pulse is within the threshold amplitude range, then the out-of-range detector may transmit an in-range indication. When the amplitude of the first galvanic isolator pulse and/or the second galvanic isolator pulse is not within the threshold amplitude range, then the out-of-range detector may transmit an out-of-range indication. The in-range indication or out-of-range indication may be received by pulse reshape and envelope detector 712. Pulse reshape and envelope detector 712 may use the first amplified trimmed pulse and the second amplified trimmed pulse corresponding to the first galvanic isolator pulse and the second galvanic isolator pulse, respectively, when an in-range indication is received. Alternatively, pulse reshape and envelope detector 712 may not use the first amplified trimmed pulse and/or the second amplified trimmed pulse when an out-of-range indication is received.

Pulse reshape and envelope detector 712 may generate a PWM out signal 704B based on one or both of the first amplified trimmed pulse and the second amplified trimmed pulse. The PWM out signal 704B may be generated by, for example, re-shaping the first amplified trimmed pulse and/or the second amplified trimmed pulse, by generating a PWM signal using one or both of the first amplified trimmed pulse and the second amplified trimmed pulse (e.g., by selecting one or the other, by averaging both, by performing an operation on one or both, etc.). According to one or more embodiments, a signal associated with the first amplified trimmed pulse and or the second amplified trimmed pulse (e.g., a signal transmitted by the pulse transceiver) may be included or otherwise used based on the PWM out signal 704B. The PWM out signal 704B may be output in reference to a high voltage area 704 drain voltage VDDH 704A and/or a high voltage area 704 reference ground GNDH 704C.

Figure 9:
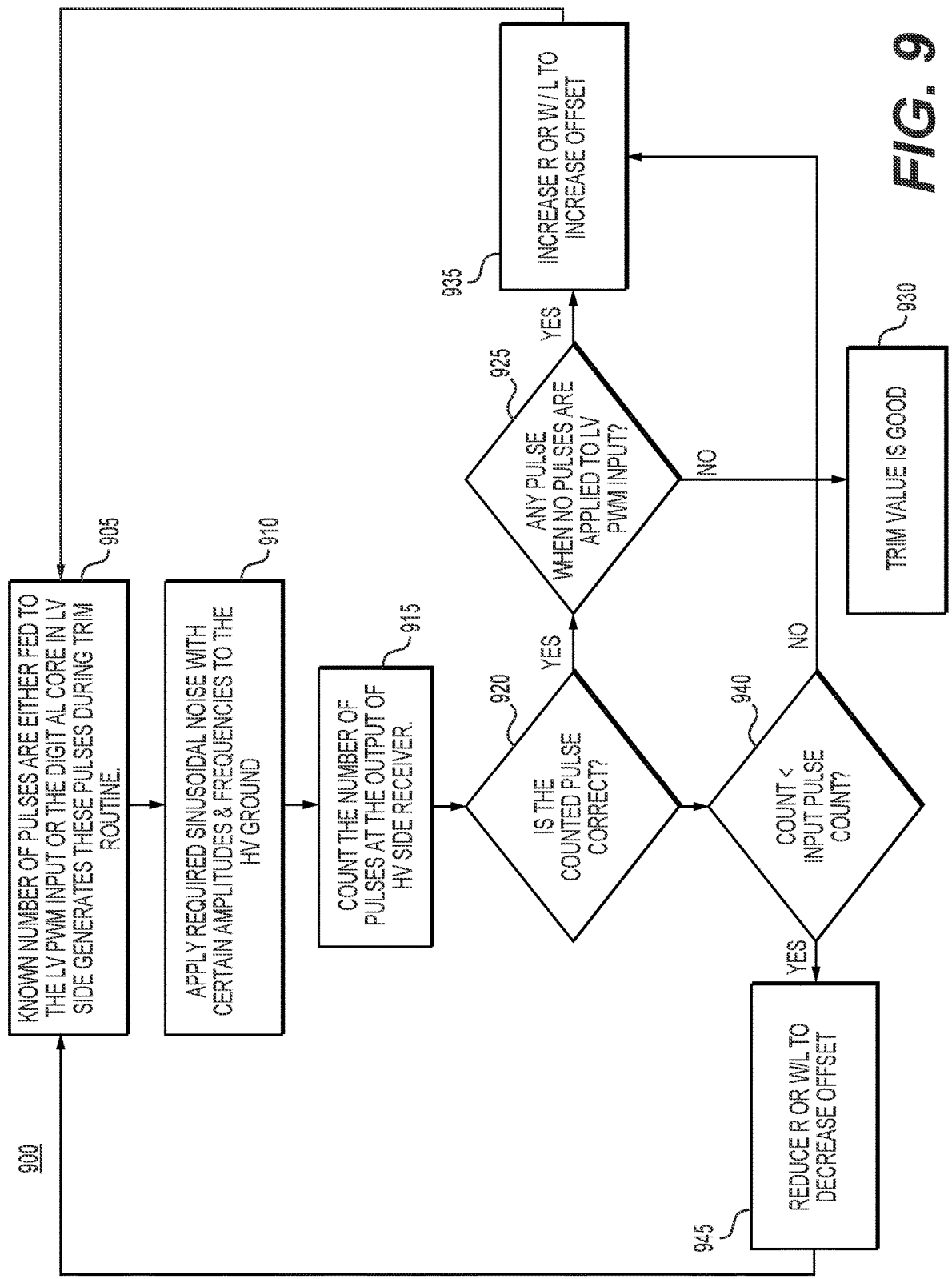
FIG. 9 depicts an exemplary trim procedure, according to one or more embodiments.

FIG. 9 depicts an exemplary trim procedure 900, according to one or more embodiments. In operation 905, a predetermined number of pulses may be either fed to pulse transceiver 706 (e.g. via PWM-in signal 702B) or pulse transceiver 706 may generate the predetermined number of pulses during a trim procedure. In operation 910, while the predetermined number of pulses is transmitted from pulse transceiver 706 to amplifier 708, a noise signal, such as a sinusoidal signal with predetermined amplitudes and frequencies, may be applied to high voltage area 704 reference ground GNDH 704C of the phase controller 700. In operation 915, while the noise signal is applied, pulse reshape and envelope detector 712 may count the number of pulses received from pulse transceiver 706. In operation 920, pulse reshape and envelope detector 712 may compare the counted number of pulses to the predetermined number of pulses.

In operation 925, if the counted number of pulses is equal to the predetermined number of pulses, pulse reshape and envelope detector 712 may determine whether any pulses are received when no pulses are transmitted from pulse transceiver 706 to amplifier 708 and the noise signal is applied. In operation 930, if no pulses are received, then the trim value of tunable filter 708-2 may be correct. In operation 935, if pulses are received in operation 925, then the trim value of tunable filter 708-2 may be increased (an increase in a DC offset between first galvanic isolator 722 and second galvanic isolator 724) by increasing either a load resistor or a width/length aspect ratio of input pairs. The trim procedure 900 may then proceed to operation 905 to re-check the trim value.

In operation 940, if the counted number of pulses in operation 920 is less than the predetermined number of pulses, then in operation 945, the trim value of tunable filter 708-2 may be decreased (a decrease in a DC offset between first galvanic isolator 722 and second galvanic isolator 724) by decreasing either a load resistor or a width/length aspect ratio of input pairs. The trim procedure 900 may then proceed to operation 905 to re-check the trim value. In operation 940, if the counted number of pulses in operation 920 is more than the predetermined number of pulses, then the trim procedure 900 may proceed to operation 935 to increase the trim value of tunable filter 708-2, and then proceed to operation 905 to re-check the trim value.

FIG. 10 depicts an exemplary operation 1000 of out-of-range detector 714, according to one or more embodiments. FIG. 10 shows a waveform at the input to out-of-range detector 714. The complementary signals form the input to first stage amplifier 708-1, and should lie within the in-range region 1020. A −CMTI or +CMTI event results in the DC operating point of the first stage amplifier 708-1 to be in out-of-range region 1010 or 1030, which saturates first stage amplifier 708-1. When the input signal is in the out-of-range region 1010 or 1030 during a CMTI event, the out-of-range detector 714 may send a signal to pulse reshape and envelope detector 712 to hold a previous state. Out-of-range detector 714 may also detect when a signal is in out-of-detection range 1040.

Figure 11:
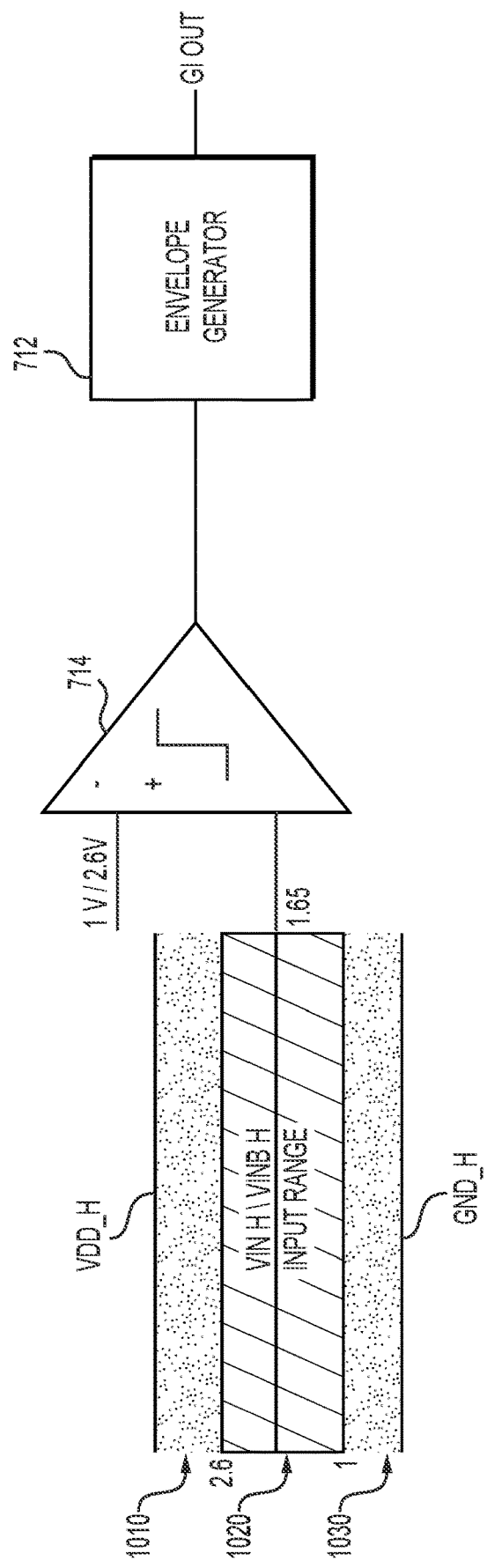
FIG. 11 depicts an exemplary out-of-range detector, according to one or more embodiments.

FIG. 11 depicts an exemplary out-of-range detector 714, according to one or more embodiments. As shown in FIG. 11, the input of amplifier 708 is also connected to out-of-range detector 714. When the input signal is in the out-of-range region 1010 or 1030 during a CMTI event, a comparator of the out-of-range detector 714 may send a signal to pulse reshape and envelope detector 712 to hold a previous state.

Figure 12:
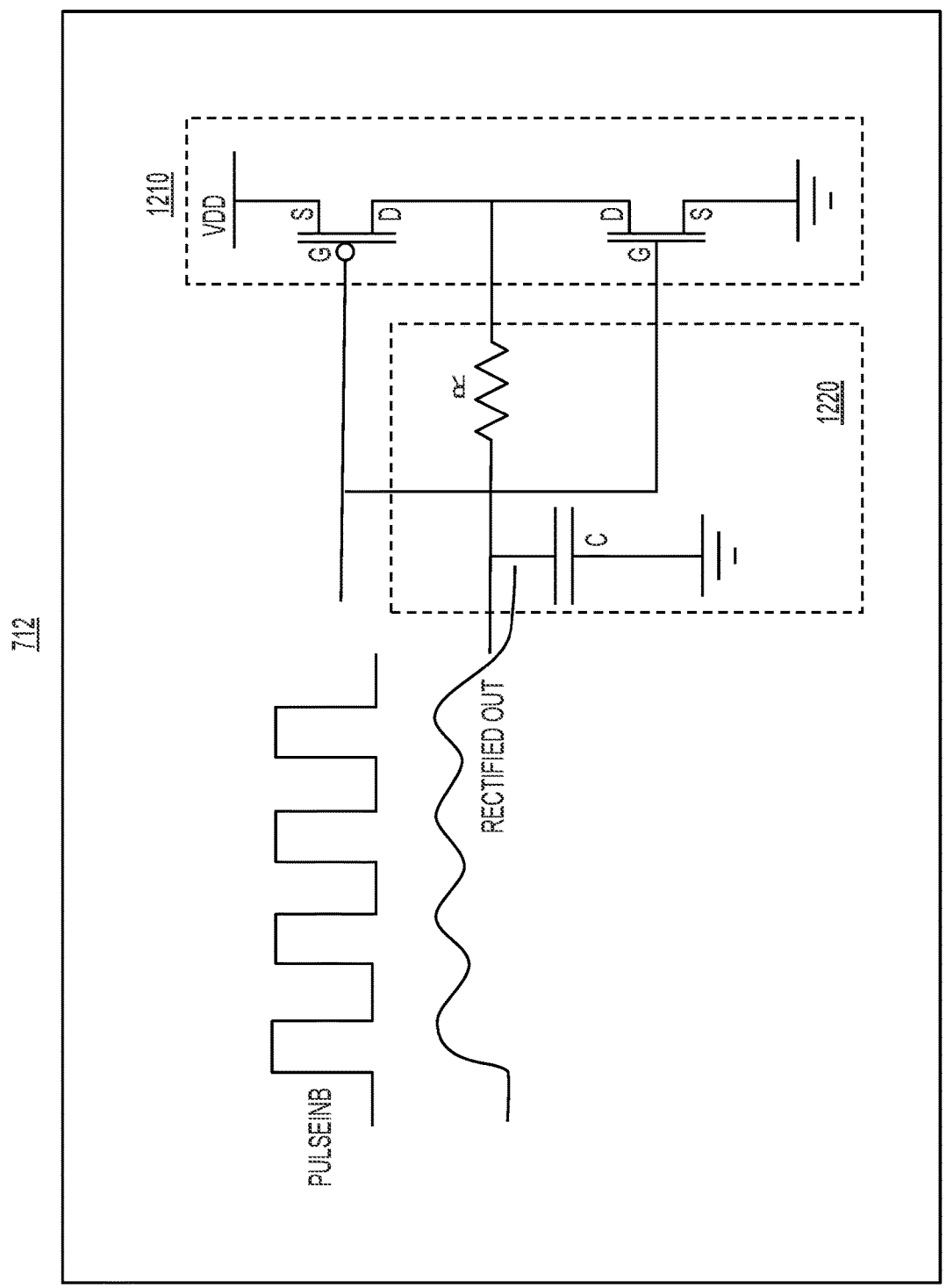
FIG. 12 depicts an exemplary pulse reshape and envelope detector, according to one or more embodiments.

FIG. 12 depicts an exemplary pulse reshape and envelope detector 712, according to one or more embodiments. As shown in FIG. 12, a simplified schematic of pulse reshape and envelope detector 712 may include a rectifier 1210 and an RC filter 1220. A stream of pulses turns either on or off the two switches that connect the capacitor to either a VDD supply or ground. By adjusting the duty cycle (pulse width) of the incoming data pulse or RC time constant, an envelope can be recreated. The output of the rectifier 1210 may be further filtered, and the amplitude may be enhanced to a full supply range before sending the signal to a final comparator.

One or more embodiments may address electromagnetic interference (EMI) that may compromise operation of galvanic transceivers. One or more embodiments may address a wide range of CMTI tolerances. One or more embodiments may address electromagnetic compatibility (EMC) concerns such as common-mode radio frequency interference (CMRFI) arising due to radio frequency (RF) noise being coupled or induced into a high voltage (e.g., a non-ground referenced voltage) operating plane, which may compromise the operation of galvanic transceivers. One or more embodiments may address common-mode noise rejection. One or more embodiments may address EMC issues including long-duration common-mode transient immunity (LD-CMTI) events, which may be longer in duration than the traditional CMTI. One or more embodiments may address slewing events that may last up to approximately 300 nanoseconds, and may cause the inputs of a receiver to be driven out-of-range, which may disrupt communication for an extended period.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
an inverter configured to convert DC power from a battery to AC power to drive a motor, wherein the inverter includes:
a first galvanic isolator separating a low voltage area from a high voltage area, the first galvanic isolator having a first galvanic isolator output path;
a second galvanic isolator separating the low voltage area from the high voltage area, the second galvanic isolator having a second galvanic isolator output path;
an amplifier in the high voltage area, connected to the first galvanic isolator via the first galvanic isolator output path, and connected to the second galvanic isolator via the second galvanic isolator output path, the amplifier having a first amplifier output path and a second amplifier output path;
a comparator in the high voltage area, and connected to the amplifier via the first amplifier output path and the second amplifier output path, the comparator having a first comparator output path and a second comparator output path; and
a pulse reshape and envelope detector in the high voltage area, and connected to the comparator via the first comparator output path and the second comparator output path.

2. The system of claim 1, further comprising:
a pulse transceiver in the low voltage area, the pulse transceiver connected to the first galvanic isolator via a first pulse transceiver output path and connected to the second galvanic isolator via a second pulse transceiver output path.

3. The system of claim 2, wherein the pulse transceiver, the amplifier, the comparator, and the pulse reshape and envelope detector are configured to operate together to transmit a Pulse Width Modulation signal from the low voltage area to the high voltage area.

4. The system of claim 2, wherein the pulse transceiver is configured to output a first pulse on the first pulse transceiver output path and a second pulse on the second pulse transceiver output path.

5. The system of claim 4, wherein the pulse transceiver is further configured to receive a primary pulse, and output the first pulse and the second pulse, based on the received primary pulse.

6. The system of claim 4, wherein:
the first galvanic isolator is configured to receive the first pulse on the first pulse transceiver output path, and send a first galvanic isolator pulse on the first galvanic isolator output path based on the received first pulse, and
the second galvanic isolator is configured to receive the second pulse on the second pulse transceiver output path, and send a second galvanic isolator pulse on the second galvanic isolator output path based on the received second pulse.

7. The system of claim 6, wherein the amplifier is configured to:
receive the first galvanic isolator pulse on the first galvanic isolator output path, amplify the first galvanic isolator pulse based on one or more properties of the amplifier, and send a first amplified pulse on the first amplifier output path based on the amplified first galvanic isolator pulse, and
receive the second galvanic isolator pulse on the second galvanic isolator output path, amplify the second galvanic isolator pulse based on one or more properties of the amplifier, and send a second amplified pulse on the second amplifier output path based on the amplified second galvanic isolator pulse.

8. The system of claim 7, wherein the comparator is configured to:
receive the first amplified pulse on the first amplifier output path, receive the second amplified pulse on the second amplifier output path, perform a comparison of the first amplified pulse with the second amplified pulse, output a first compared pulse on the first comparator output path based on the comparison, and output a second compared pulse on the second comparator output path based on the comparison.

9. The system of claim 8, wherein the pulse reshape and envelope detector is configured to:
receive the first compared pulse on the first comparator output path, receive the second compared pulse on the second comparator output path, and output an output pulse based on the first compared pulse and the second compared pulse.

10. The system of claim 1, wherein the amplifier includes:
a trimmer, and
a tunable filter.

11. The system of claim 1, further comprising:
an out-of-range detector connected to the first galvanic isolator, the second galvanic isolator, and the pulse reshape and envelope detector.

12. The system of claim 1, wherein the comparator further comprises a resistor averaging circuit.

13. The system of claim 1, further comprising:
the battery configured to supply the DC power to the inverter; and
the motor configured to receive the AC power from the inverter to drive the motor.

14. A method comprising:
receiving, by one or more controllers, a first pulse, and transmitting, by the one or more controllers, a first galvanic isolator pulse based on the first pulse;
receiving, by the one or more controllers, a second pulse, and transmitting by the one or more controllers, a second galvanic isolator pulse based on the second pulse;
receiving, by the one or more controllers, the first galvanic isolator pulse and the second galvanic isolator pulse;
generating, by the one or more controllers, a first amplified pulse based on the first galvanic isolator pulse and a second amplified pulse based on the second galvanic isolator pulse;
receiving, by the one or more controllers, the first amplified pulse and the second amplified pulse;
comparing, by the one or more controllers, the first amplified pulse and the second amplified pulse;

determining, by the one or more controllers, a mitigation action based on the comparing; and generating, by the one or more controllers, an output pulse based on the mitigation action.

15. The method of claim 14, wherein the determining the mitigation action comprises:

determining, by the one or more controllers, a difference between one or more signal properties of the first amplified pulse and one or more signal properties of the second amplified pulse;

comparing, by the one or more controllers, the difference to a difference threshold; and determining, by the one or more controllers, the mitigation action based on the comparing the difference to the difference threshold.

16. The method of claim 14, wherein the generating the output pulse comprises maintaining a previous signal state based on one or more of a previous first galvanic isolator pulse or a previous second galvanic isolator pulse.

17. The method of claim 14, further comprising:

trimming, by the one or more controllers, one or more of the first galvanic isolator pulse or the second galvanic isolator pulse.

18. The method of claim 14, further comprising:

determining, by the one or more controllers, one of an in-range indication or an out-of-range indication based on the first galvanic isolator pulse and the second galvanic isolator pulse.

19. The method of claim 18, wherein the generating the output pulse comprises generating the output pulse based on the one of the in-range indication or the out-of-range indication.

20. A system comprising:

a first galvanic isolator configured to receive a first pulse from a pulse transceiver and output a first galvanic isolator pulse based on the received first pulse;

a second galvanic isolator configured to receive a second pulse from the pulse transceiver and generate a second galvanic isolator pulse based on the received second pulse;

an amplifier configured to receive the first galvanic isolator pulse and the second galvanic isolator pulse, amplify the first galvanic isolator pulse and the second galvanic isolator pulse as a first amplified pulse and a second amplified pulse, respectively, and output the first amplified pulse and the second amplified pulse;

a comparator configured to receive the first amplified pulse and the second amplified pulse, perform a comparison of the first amplified pulse to the second amplified pulse, and generate a first compared pulse and a second compared pulse, respectively, based on the comparison; and a pulse reshape and envelope detector configured to receive the first compared pulse and the second compared pulse, and generate an output pulse based on the first compared pulse and the second compared pulse.

* * * * *